Figure 1:
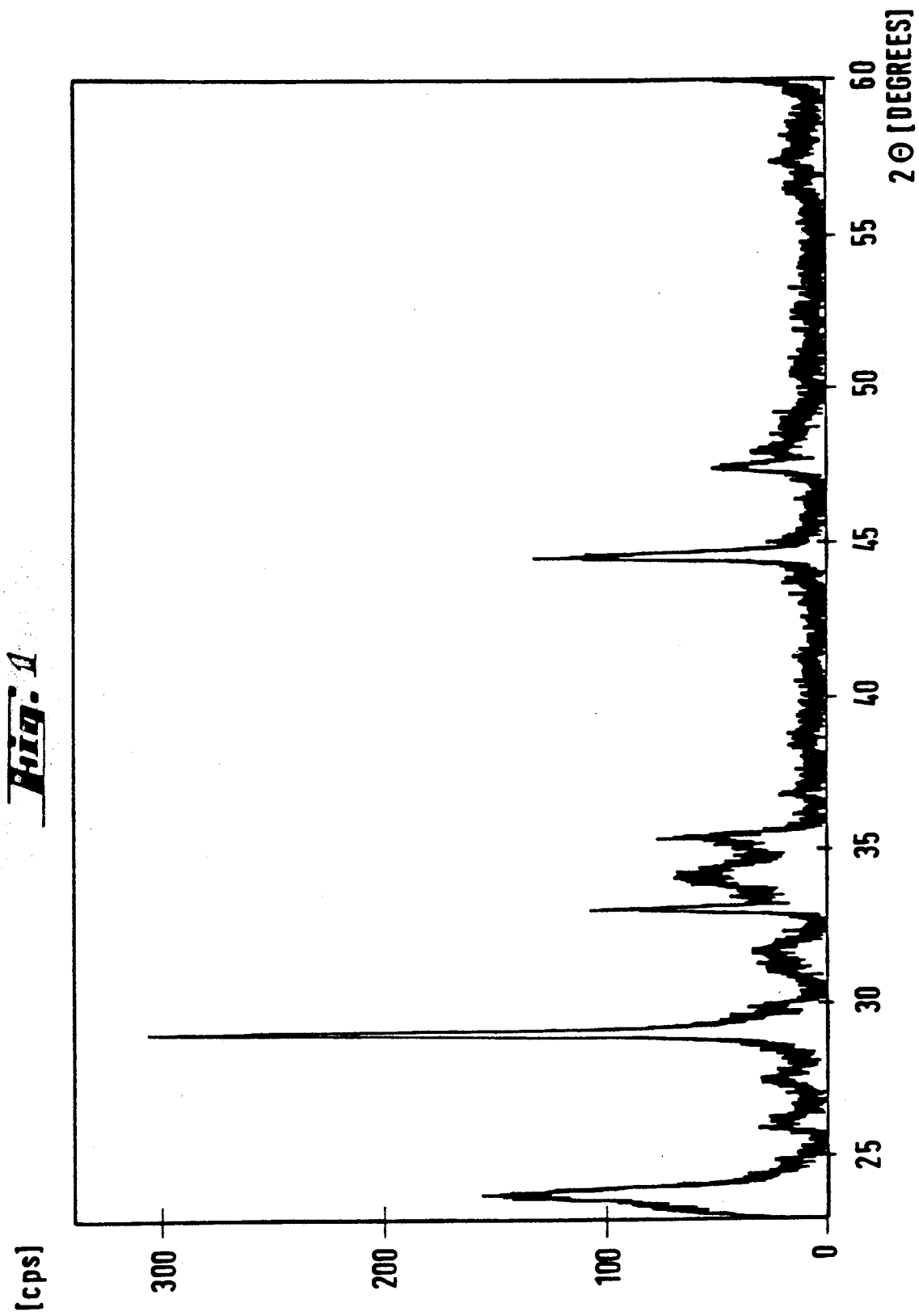

United States Patent [19]

Hettich et al.

[11] Patent Number: 5,250,509
[45] Date of Patent: Oct. 5, 1993

[54] BISMUTH-CONTAINING SUPERCONDUCTING MATERIAL AND PROCESS FOR PRODUCING IT

[75] Inventors: Bernhard Hettich, Eppstein; Peter Majewski, Rudersberg; Klaus Schulze, deceased, late of Stuttgart, by Heidemarie Schulze, heir; Günter Petzow, Leinfelden-Echterdingen, all of Fed. Rep. of Germany

[73] Assignee: Hoechst Aktiengesellschaft, Frankfurt, Fed. Rep. of Germany

[21] Appl. No.: 839,324

[22] Filed: Feb. 20, 1992

[30] Foreign Application Priority Data

Mar. 19, 1991 [DE] Fed. Rep. of Germany ....... 4108869

[51] Int. Cl.$^5$ .................... C01F 11/02; C01G 3/02; C01G 29/00; H01L 39/12
[52] U.S. Cl. ..................... 505/1; 252/518; 252/521; 505/782
[58] Field of Search ............. 505/1, 782; 252/518, 252/521

[56] References Cited

FOREIGN PATENT DOCUMENTS 2654719 5/1991 France .

OTHER PUBLICATIONS

Jones "Substitutions of 3-d transition metals ions . . ." *Physica C* v.162-4 Dec. 1989 pp. 25-26.
Gyorgy "Magnetization and critical currents of Bi-Sr-Ca-Cu-O . . ." *Appl. Phys. Lett.* v. 53 (22) Nov. 28, 1988 pp. 2223-2225.
Ono "A 105 K Superconducting phase in the Bi-Sr-Ca-Cu-O . . ." *Jap. Jnl. Appl. Phys.* v. 27(6) Jun. 1988 p. L1007-8.
Partial translation of Japanese Patent Laid-open No. 243519/1990, Sep. 27, 1990.
Patent Abstracts of Japan, vol. 14, No. 562 (C-788), Dec. 13, 1990 & JP-A-22 43 519 (Chodendo Hatsuden K), Sep. 27, 1990.
Materials Science Forum, Bd. 62-64, Apr. 27, 1990, pp. 87-88, V. S. Kravchenko "Synethesis of Bismuth-Containing High-Tc Ceramics".

*Primary Examiner*—Paul Lieberman
*Assistant Examiner*—John Boyd
*Attorney, Agent, or Firm*—Connolly & Hutz

[57] ABSTRACT

The invention relates to an oxide-ceramic superconducting material which contains bismuth, strontium, calcium and copper, having an overall composition of $Bi_yCa_2Sr_2Cu_3O_x$, where y is an integer from 2.35 to 2.6 and x is about 10 to 12. The material has a critical temperature T above 105 K and has a proportion of the phase $Bi_2Sr_2Ca_2Cu_3O_x$ of at least 85% by volume. The invention also relates to a process for producing a bismuth-containing superconducting material which comprises holding the oxides or oxide precursors of bismuth, strontium, calcium and copper at a temperature in the range from 850° to 890° C. over a time span of a plurality of hours and adhering to the following atomic ratios:

Bi:Cu > 2:3

Ca:Sr = 0.9 to 1.50

$\Sigma$(Sr+Ca):Cu = 4.2:3 to 4:3.33

Bi:$\Sigma$(Sr+Ca) = 2.35:4 to 3.1:4

10 Claims, 5 Drawing Sheets

BISMUTH-CONTAINING SUPERCONDUCTING MATERIAL AND PROCESS FOR PRODUCING IT

DESCRIPTION

The invention relates to an oxide-ceramic superconducting material which contains bismuth, strontium, calcium and copper, and to a process for producing it.

The quaternary system $Bi_2O_3$-$SrO$-$CaO$-$CuO$ is remarkable for the occurrence of three superconducting phases, namely $Bi_2Sr_2CuO_6$ ("2201 phase" or "Raveau phase" having $T_c = 9$ K), $Bi_2Sr_2CaCu_2O_8$ ("2212 phase" with $T_c = 90$ K) and $Bi_2Sr_2Ca_2Cu_3O_{10}$ ("2223 phase" with $T_c = 110$ K). The identification of the 2223 phase as the most important superconducting phase dates back to J. L. Tallon et al., Nature 333 (1988), Page 153. Attempts have therefore been made to produce phase-pure 2223 samples. However, this is difficult by powder-metallurgy means. It is furthermore known that the 2223 phase is an independent compound having a stability range between $T = 850°$–$890°$ C. and is particularly stable if the proportion of bismuth in this system is higher than corresponds to the ideal composition 2223 (K. Schulze et al., Zeitschrift für Metallkunde, vol. 81 (1990), page 836).

The object of the present invention was therefore to provide a novel bismuth-containing oxide-ceramic superconducting material which is remarkable for a particularly high proportion of 2223 phase, and to provide a novel process which makes it possible in a simple way to achieve as high as possible a yield of proportions of 2223 phase in the production of bismuth-containing oxide-ceramic superconducting material.

This object is achieved by a material of the type mentioned at the outset which has an overall composition of $Bi_ySr_2Ca_2Cu_3O_x$, where y is an integer from 2.35 to 2.6 and x is about 10 to 12, and which has a critical temperature $T_c$ above 105 K and a proportion of the phase $Bi_2Sr_2Ca_2Cu_3O_x$ of at least 85% by volume. Preferably, y is in the range from 2.45 to 2.55 and the proportion of the phase $Bi_2Sr_2Ca_2Cu_3O_x$ is above 90% by volume.

The object of the invention is furthermore achieved by a process for producing an oxide-ceramic superconducting material which contains bismuth, strontium, calcium and copper, which process comprises holding the oxides or oxide precursors of bismuth, strontium, calcium and copper at a temperature in the range from 850° to 890° C. over a time span of a plurality of hours and adhering to the following atomic ratios:

Bi:Cu > 2:3

Ca:Sr = 0.9 to 1.50

Σ(Sr + Ca):Cu = 4.2:3 to 4:3.33

Bi:Σ(Sr + Ca) = 2.35:4 to 3.1:4

Preferably, the Ca:Sr atomic ratio in the oxide mixture is kept in the range from 0.95 to 1.35, in particular in the range from 0.95 to 1.05. In a further preferred embodiment of the invention, the Σ(Sr + Ca):Cu atomic ratio in the oxide mixture is 4.1:3 to 4:3.1, in particular 4:3 to 4:3.1. According to the invention, the Bi:Σ(Sr + Ca) atomic ratio in the oxide mixture is furthermore preferably within the range from 2.4:4 to 2.6:4, in particular from 2.45:4 to 2.55:4. Instead of the oxides of strontium, calcium and copper, other salts of the elements mentioned which decompose to form the oxides at the reaction temperatures, so-called oxide precursor salts may also be used. Typical examples of such salts are the carbonates and the nitrates.

It is advantageous if the mixture of oxides is first heated for at least 2 hours at 700°–800° C. After cooling, the roasted mixture is homogenized and then heated to temperatures from 850° to 890° C. It is still better if the product obtained at 700° to 800° C. is heated again for at least 2 hours at 800°–860° C. after homogenization, homogenized again after cooling and only then heated to temperatures of 860° to 890° C.

If the mixture, which is heated to temperatures of 860° to 890° C., is previously compressed to form a molding, it is possible, surprisingly, to obtain superconducting moldings, for example in tablet form.

The cooling to room temperature from 860° to 890° C. preferably proceeds slowly. It is beneficial if the mixture is allowed to cool in the furnace itself. In this connection, cooling rates of 2° to 10°/min have been found to be best.

The proportion of the superconducting 2223 phase in the superconducting material is particularly high, according to the invention, if heating is carried out for at least 50 hours at 700° to 800° C. and, in particular, additionally for a further 50 hours at 830° C. The heating is preferably carried out in the presence of oxygen, in particular in air. The treatment of the mixture at temperatures of 850° to 890° C. should preferably extend over a time period of more than 24 hours, in particular in the range from 40 to 200 hours, particularly preferably from 60 to 150 hours, and also takes place in the presence of oxygen. All in all, longer roasting times (t > 150 h) are required at lower sintering temperatures (T < 880° C.) in order to obtain comparable results in relation to the proportion by volume of the 2223 phase, and vice versa. A temperature of 890° C. should not, however, be exceeded.

The products obtained by the process according to the invention contain approximately 92% by volume of 2223 phase, 2 to 3% by volume of 2212 phase and approximately 5% by volume of copper oxide plus alkaline-earth cuprates.

The invention is explained in greater detail by the illustrative examples below, without, however, being limited to the concrete embodiments disclosed.

EXAMPLE 1

The starting material used was $Bi_2O_3$, $SrCO_3$, $CaCO_3$ and CuO(purity 99%). A sample with the weighed proportion $Bi_{2.5}Sr_2Ca_2Cu_3O_x$ was prepared. The homogenized starting powder was calcined in accordance with the following program:

a) hold for 60 hours at 790° C. in air, and b) hold for 2×60 hours at 830° C. in air.

Between each of the roastings, the powders were homogenized in an agate mortar. After repeated homogenization, cylindrical bodies approximately 1.5 cm long and 4 to 5 mm in diameter were molded from the powders. The moldings were sintered for 90 hours at 885° to 890° C.

The qualitative phase identification was carried out by means of:

Optical microscopy in polarized incident light (structural analysis),
  instrument: Zeiss AXIOMAT
  magnification: 25 to 100×.

X-ray diffraction measurement of the powdered samples (XRD),
  measuring instrument: powder diffractometer PW 1050 supplied by Philips (40 kV, 25 mA),
  radiation: Cu K$_{60}$, $\lambda = 0.154056$ nm with graphite monochromator.
Scanning electron microscope (SEM)
  instrument: Cambridge Muster S 200 (15 kV, 1.10 mA)
  magnification: 200 to 2000×, with energy-dispersive x-ray emission analysis instrument connected (EDX) or (EDAX),
  type: AN 10 000, supplied by Link
  resolution: approximately 1 μm.

The qualitative phase identification revealed various amounts of 2212 and 2223 phase, copper oxide and cuprate (Ca, Sr)$_2$CuO$_3$, as sample constituents.

The percentages by volume of the individual phases were determined quantitatively by the following method:

a) the 2212 phase, the 2223 phase, the cuprate and the copper oxide phase components were determined in an incident light microscope by the point counting method.

b) The 2212 and 2223 phases cannot be distinguished from one another in an incident light microscope. The percentages by volume of the 2212 and 2223 phase were therefore determined with the aid of X-ray diffraction (XRD) as described by H. Kirschner, Einführung in die Röntgenfeinstrukturanalyse (Introduction to X-ray fine structure analysis), Vieweg-Verlag (1980), Chapters 1 to 4. For this purpose, the ratio of the area integrals of the strongest diffraction reflection in each case of the 2212 phase (hkl 115, $2\theta = 27.5°$) and the 2223 phase (hkl = 117, $2\theta = 28.78°$) was taken (FIG. 1). a) and b) yield the percentages by volume of the compounds mentioned with an accuracy of 2 to 5%, based on the relevant value.

c) The superconducting proportion by volume of the two superconducting phases 2212 and 2223 in % was determined by measuring the magnetic susceptibility as described by W. Buckel, Supraleitung (Superconduction), Verlag Chemie (1990), and Gerthsen et al., Physik (Physics), Springer Verlag (1977), of the samples in an induction measuring bridge at:

$\nu = 10$ kHz, T = 3 to 300 K.

The ideal diamagnetic material, which would be 100% superconducting, displaces the external magnetic field to an extent of 100%. This state is by definition equal to $-1$ and dimensionless. The partial degree of saturation of the diamagnetic signal as the temperature drops (a number between 0 and $-1$) is expressed in %. Extrapolation to the vertical axis in FIGS. 2 to 4 yields the respective proportions of the superconducting phases in the respective samples.

The proportion of 2223 phase in the material according to Example 1 was determined corroboratively as 92% by volume by both methods.

EXAMPLE 2

Figure 3:
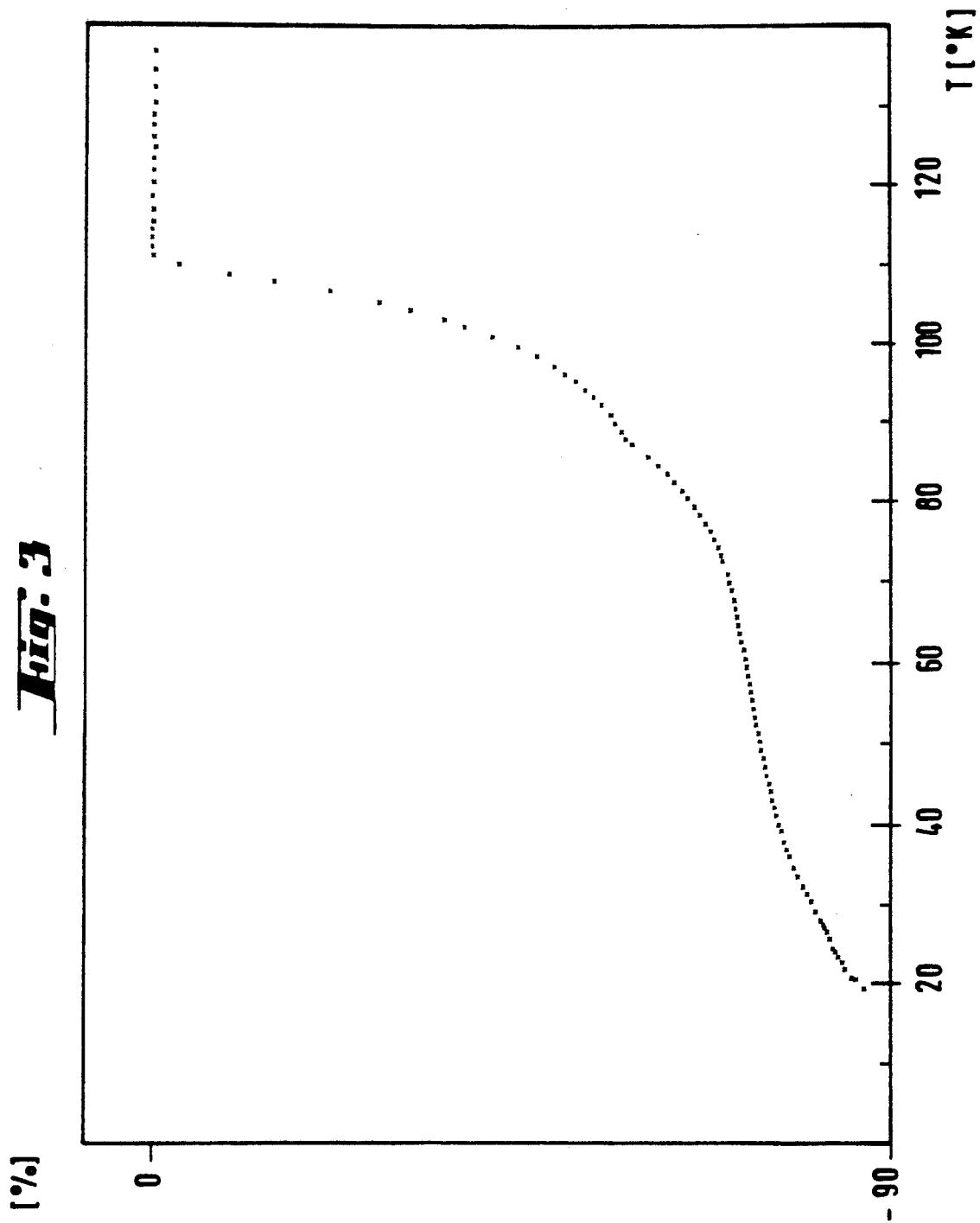

Example 1 was repeated, but with the starting composition Bi$_{2.6}$Sr$_{2.3}$Ca$_{1.9}$Cu$_3$O$_x$. The proportion of 2223 phase is, however, only 70% by volume, as emerges from the measurement of the magnetic susceptibility (FIG. 3).

EXAMPLE 3 (COMPARISON EXAMPLE)

Figure 4:
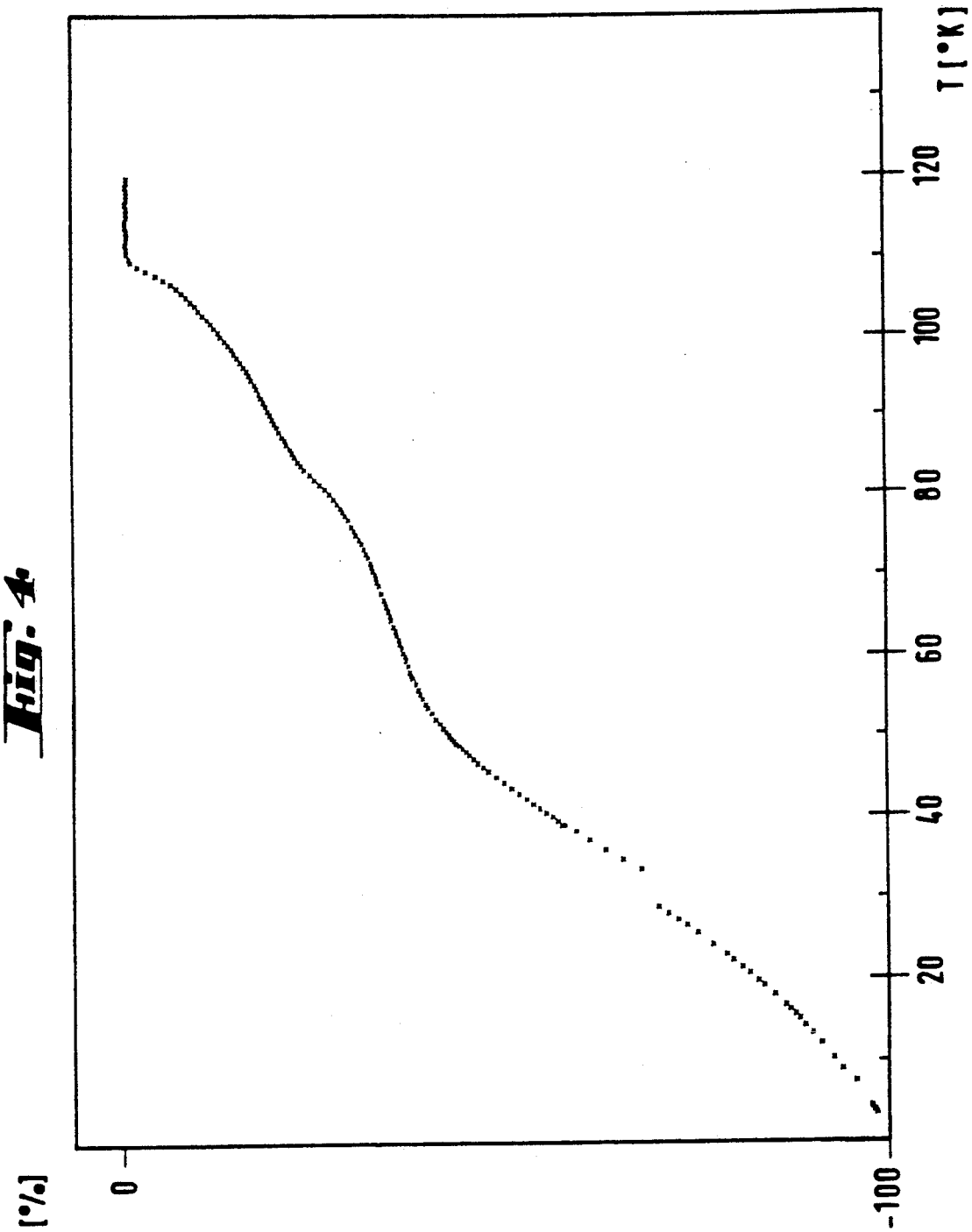

Example 1 was repeated, but with an overall composition of the starting mixture of Bi$_{2.3}$Sr$_2$Ca$_2$Cu$_3$O$_x$. The proportion of 2223 phase was less than 20% by volume (FIG. 4).

EXAMPLE 4 (COMPARISON EXAMPLE)

Figure 5:
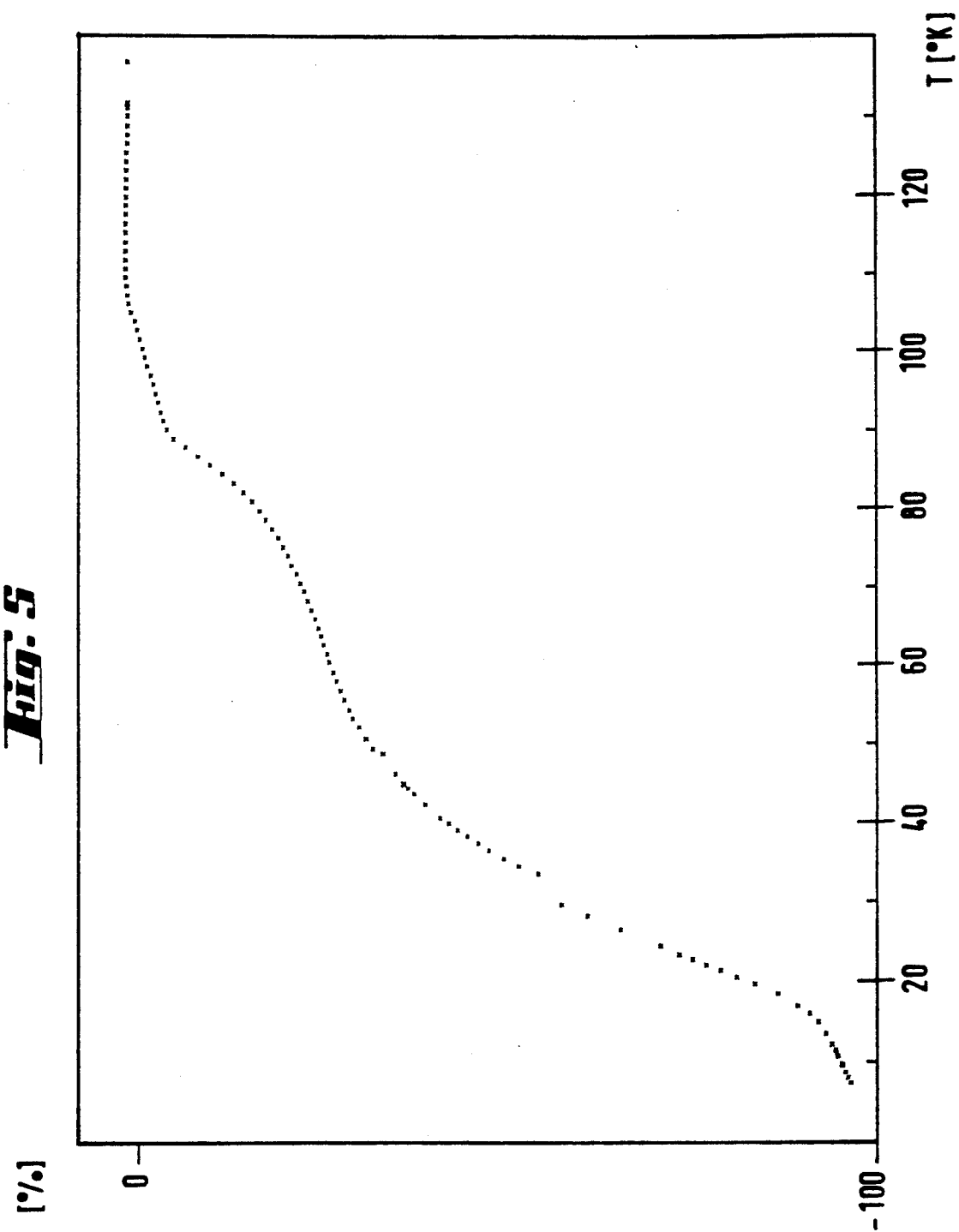

A similar result as in Example 3 is also obtained if the composition of the starting mixture is identical with the formal composition of the 2223 phase (FIG. 5).

DETAILED KEY TO THE FIGURES

Figure 2:
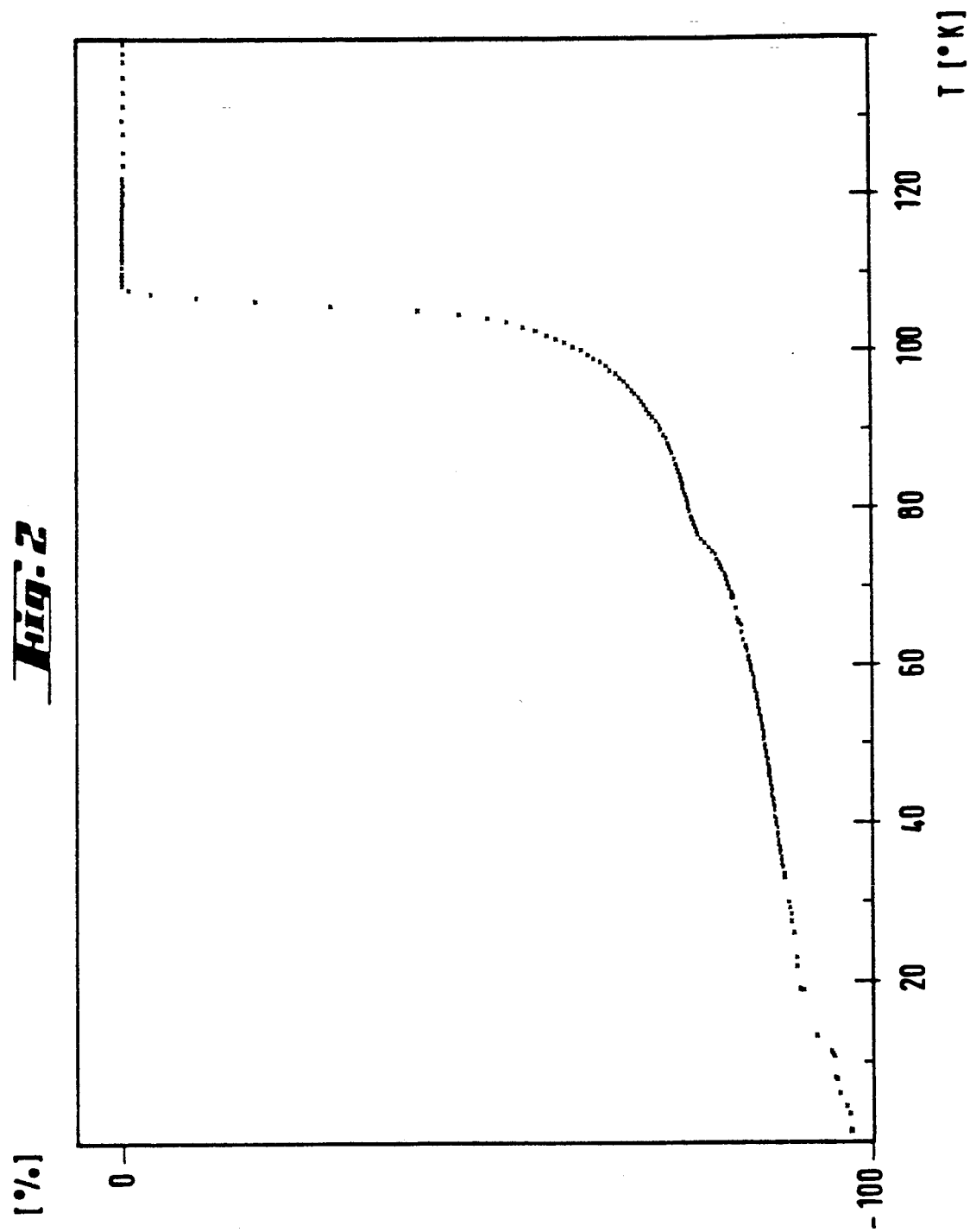

FIG. 1 intensity of the X-ray radiation reflected through $2\theta$ (=diffraction angle) (arbitrary units) of the sample obtained according to Example 1, determined of a wavelength of 154,056 pm FIG. 2 Superconducting proportion by volume [in %] plotted against the absolute temperature of the sample obtained according to Example 1.

FIG. 3 Superconducting proportion by volume [in %] plotted against T of the sample obtained according to Example 2.

FIG. 4. Superconducting proportion by volume [in %] plotted against T of the Bi$_{2.3}$Sr$_2$Ca$_2$Cu$_3$O$_x$ sample obtained according to Example 3.

FIG. 5 Superconducting proportion by volume [in %] plotted against T of the Bi$_2$Sr$_2$Ca$_2$Cu$_3$O$_x$ sample obtained according to Example 3.

We claim:

1. An oxide-ceramic superconducting material which consists essentially of bismuth, strontium, calcium and copper and has an overall composition of Bi$_y$Ca$_2$Sr$_2$Cu$_3$O$_x$, where y is an integer from 2.35 to 2.6 and x is about 10 to 12, and which has a critical temperature T$_c$ above 105 K and a proportion of the phase Bi$_2$Sr$_2$Ca$_2$Cu$_3$O$_x$ of at least 85% by volume.

2. An oxide-ceramic superconducting material as claimed in claim 1, wherein y is an integer in the range from 2.45 to 2.55 and wherein the proportion of the phase Bi$_2$Sr$_2$Ca$_2$Cu$_3$O$_x$ is above 90% by volume.

3. A superconducting molding having an overall composition of Bi$_y$Ca$_2$Sr$_2$Cu$_3$O$_x$, where y is an integer from 2.35 to 2.6 and x is about 10 to 12, the material of the molding having a critical temperature T$_c$ above 105 K and a proportion of the phase Bi$_2$Sr$_2$Ca$_2$Cu$_3$O$_x$ of at least 85% by volume.

4. A superconducting molding as claimed in claim 3, wherein y is an integer from 2.45 to 2.55.

5. A superconducting molding as claimed in claim 3, which has a proportion of the phase Bi$_2$Sr$_2$Ca$_2$Cu$_3$O$_x$ of at least 90% by volume.

6. An oxide-ceramic superconducting material which consists essentially of bismuth, strontium, calcium and copper and has an overall composition of Bi$_y$Ca$_2$Sr$_2$Cu$_3$O$_x$, where y is an integer from 2.35 to 2.6 and x is about 10 to 12, and which has a critical temperature Tc above 105 K and a proportion of the phase Bi$_2$Sr$_2$Ca$_2$Cu$_3$O$_x$ of at least 85% by volume, said material being produced by a method comprising:

a) preparing a mixture consisting essentially of oxide or oxide precursors of bismuth, strontium, calcium and copper in the following atomic ratios:
Bi:Cu > 2:3
Ca:Sr = 0.9 to 1.50
$\Sigma$(Sr+Ca):Cu = 4.2:3 to 4:3.33
Bi:$\Sigma$(Sr+Ca) = 2.35:4 to 3.1:4; and b) holding said mixture at a temperature of from 850° to 890° C. for a plurality of hours.

7. The oxide-ceramic superconducting material of claim 6, wherein said method further comprises heating said mixture for at least two hours at a temperature of from 700°-800° C. before said holding step.

8. The oxide-ceramic superconducting material of claim 6, wherein said method further comprises heating said mixture for at least two hours at a temperature of from 800°-860° C. before said holding step.

9. The oxide-ceramic superconducting material of claim 6, wherein said method further comprises heating said mixture for at least two hours at a temperature of from 700°-800° C. and homogenizing said mixture after cooling from 700°-800° C. before said holding step.

10. The oxide-ceramic superconducting material of claim 6, wherein said method further comprises heating said mixture for at least two hours at a temperature of from 800°-860° C. and homogenizing said mixture after cooling from 800°-860° C. before said holding step.

* * * * *